United States Patent [19]
Campbell

[11] 4,027,269
[45] May 31, 1977

[54] AUDIO LINE DRIVER AMPLIFIER
[75] Inventor: Whitney Robertson Campbell, Elk Grove Village, Ill.
[73] Assignee: Motorola, Inc., Schaumburg, Ill.
[22] Filed: June 30, 1975
[21] Appl. No.: 591,587
[52] U.S. Cl. .................................. 330/13; 330/15; 330/26; 330/195
[51] Int. Cl.² ............................................ H03F 1/38
[58] Field of Search ................ 330/13, 15, 17, 195, 330/26, 28, 156

[56] References Cited
UNITED STATES PATENTS

| 3,800,238 | 3/1974 | Belcher | 330/15 |
| 3,904,974 | 9/1975 | Fukaya et al. | 330/15 X |

Primary Examiner—Rudolph V. Rolinec
Assistant Examiner—Lawrence J. Dahl
Attorney, Agent, or Firm—Eugene A. Parsons; Patrick T. King; James W. Gillman

[57] ABSTRACT

A pair of complementary output transistors having common connected emitters and a primary winding of a transformer in each of the collector circuits, said transistors being biased in class AB operation with a drive transistor connected to the base thereof and a feedback circuit, including both AC and DC, connected from the common emitters to the input of the drive transistor so that the quiescent current of the amplifier is very low and the output impedance is high.

6 Claims, 1 Drawing Figure

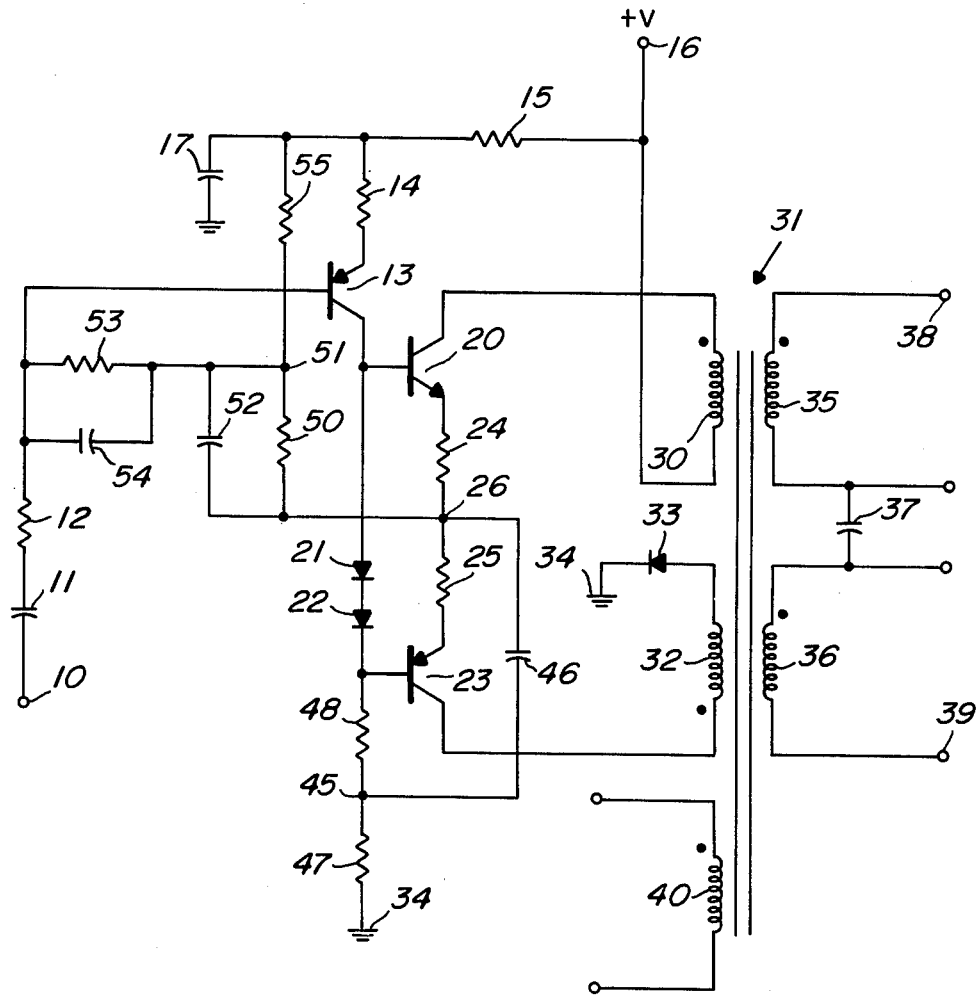

AUDIO LINE DRIVER AMPLIFIER

BACKGROUND OF THE INVENTION

1. Field of the Invention

The present invention pertains to an audio line driver amplifier which is a high performance amplifier used to amplify voice and/or tones for driving 300 to 600 ohm balanced telephone lines with levels up to 20 DBM. The output of the amplifiers must be a very high impedance so that a number of amplifiers can bridge the telephone lines simultaneously at the same location without detrimental effects on the line termination.

2. DESCRIPTION OF THE PRIOR ART

Prior art line driver amplifiers have always been push-pull class A amplifiers with a high output impedance. However, because the quiescent current of the class A amplifiers is high, relatively large amounts of power are used and much heat is generated. To dissipate the heat generated by the large current drain of the amplifiers, relatively large heat sinks are required which severely limits the size of the amplifier.

SUMMARY OF THE INVENTION

An audio line driver amplifier is disclosed which includes a pair of complementary output transistors having common connected emitters with a high impedance output in each of the collector circuits, drive means adapted to receive input signals and connected to the bases of said transistors with feedback means connected from the common emitters to the input of the drive means for feeding back both AC and DC signals, and bias means connected to the pair of output transistors for biasing said pair of output transistors so that the quiescent transistor current is less than the peak signal current in said transistors.

It is an object of the present invention to provide a new and improved audio line driver amplifier which utilizes substantially less current in both quiescent and signal modes and generates less heat.

It is a further object of the present invention to provide an audio line driver amplifier with overall feedback for both AC and DC to control the gain and minimize the distortion of the amplifier, and maintain the amplifier operating so that the quiescent transistor current is less than the peak signal current in said transistors.

These and other objects of this invention will become apparent to those skilled in the art upon consideration of the accompanying specification, claims and drawing.

BRIEF DESCRIPTION OF THE DRAWING

The single FIGURE is a schematic diagram of an audio line driver amplifier embodying the present invention.

DESCRIPTION OF THE PREFERRED EMBODIMENT

In the FIGURE the numeral 10 designates an input terminal adapted to receive audio signals thereon. The input terminal 10 is connected through a coupling capacitor 11 and series connected resistor 12 to the base of a PNP type drive transistor 13. The emitter of the transistor 13 is connected through a current limiting resistor 14 and decoupling resistor 15 to a terminal 16, adapted to have a positive source of voltage applied thereto. The junction of the resistors 14 and 15 is connected to ground through a large filter capacitor 17.

The collector of the transistor 13 is connected directly to the base of an NPN type output transistor 20 and through a pair of series connected diodes 21 and 22 to the base of a PNP type output transistor 23. The transistors 20 and 23 form a pair of complementary output transistors with the emitters coupled together through a pair of series connected resistors 24 and 25. Resistors 24 and 25 are very small in value and in size and have substantially no effect on the circuit except to limit the DC quiescent current in the output transistors 20 and 23. For purposes of the AC signal the emitters of the transistors 20 and 23 are common connected to a junction point 26 at the junction of the resistors 24 and 25.

The collector of the transistor 20 is connected through one primary winding 30 of an output transformer generally designated 31 to the positive voltage terminal 16. The collector of the transistor 23 is connected through a second primary winding 32 of the transformer 31 and a series connected diode 33 to ground 34. The primary windings 30 and 32 form outputs in the collector circuits of the transistors 20 and 23 and may be a bifilar winding on the transformer 31 to insure a balanced output. A pair of secondary windings 35 and 36 of the transformer 31 are inductively coupled to the primary windings 30 and 32, respectively, and have opposed ends connected together through a capacitor 37 to provide a single output at a pair of terminals 38 and 39, adapted to be connected to a pair of telephone lines having an impedance of 300 to 600 ohms. The transformer 31 also has a winding 40 adapted to be connected to the input of a receiver and serving as an output winding when an audio signal is received at the terminals 38 and 39 from the telephone lines.

The junction 26 between the resistors 24 and 25 is connected to a junction 45 through a large capacitor 46. The junction 45 is connected to ground 34 through a resistor 47 and to the base of the output transistor 23 through a resistor 48. The capacitor 46 and resistor 47 form a bootstrap circuit which prevents the transistor 23 from cutting off during the negative going portion of a signal. That is, as the signal at the base of the output transistor 23 drops below the point which can maintain conduction in the transistor 23, there is a tendency for the transistor to cut off. However, the capacitor 46 couples the AC voltage at the junction 26 to the junction 45 to maintain the base of the transistor 23 above cut off and thereby prevent the distortion caused by the transistor 23 cutting off on large negative going signal swings.

The junction 26 is also connected through a resistor 50 to a junction 51. A capacitor 52 is connected in parallel with the resistor 50. The junction 51 is connected through a resistor 53 to the base of the transistor 13 and a capacitor 54 is connected in parallel with the resistor 53. A resistor 55 is connected from the junction 51 to the junction of the resistor 15 and capacitor 17 and supplies a DC bias to the junction 51. The resistors 50 and 53 provide a DC feedback from the junction 26 (the emitters of the output transistors 20 and 23) to the base or input of the drive transistor 13. Through this DC feedback the drive transistor 13 is maintained conducting sufficient to allow approximately 5 milliamps of quiescent current to flow from the positive voltage terminal 16 through resistor 15, resistor 14, transistor 13, diodes 21 and 22, resistor 48 and resistor 47 to ground 34. Further, the current flowing from the positive terminal 16 through winding 30, transistor 20, resistors 24 and 25, transistor 23, winding 32 and diode 33 is dependent upon the current flowing through the diodes 21 and 22. The junction 26 is thereby maintained at a potential approximately one-half the potential applied to the positive terminal 16. This potential is fed back through the resistors 50 and 53 to the input or base of the transistor 13 to maintain the quiescent current of the circuit stable. In addition to providing a two diode drop between the bases of the transistors 20 and 23, the diodes 21 and 22 also provide some temperature compensation for the transistors 20 and 23 to maintain the DC operating points of the transistors 20 and 23 at a desired relationship.

The capacitors 52 and resistor 53 provide the AC feedback path from the junction 26 to the input or base of the transistor 13. The AC feedback resistor 53 controls the gain of the circuit and provides the amplifier with a stable, predetermined amount of gain at low distortion. The capacitor 54 controls the high frequency signal gain for the amplifier by bypassing resistor 53 at high frequencies. Thus, through the combination of the DC and AC feedback the output transistors are biased so that the quiescent transistor current is less than the peak signal current in said transistors and the gain and distortion of the amplifier is controlled. In the present embodiment the transistors 20 and 23 are operating class AB. Thus, the quiescent current is very small and the heat generated by the circuit is relatively small. Because of the small heat generation heat sinks can be very small or completely eliminated and the overall amplifier can be constructed very small. Further, because the outputs are in the collector circuits of the output transistors 20 and 23 the impedance presented to the terminals 38 and 39 is very high and a plurality of the present audio line driver amplifiers can be bridged across a pair of telephone lines at the same location. If it is desired to utilize the present amplifier to terminate a pair of telephone lines, the proper impedance can be connected across the winding 40, across each of the windings 30 and 32, or between the output terminals 38 and 39.

The following list of types and values for the components set forth above is included herein for exemplary purposes only.

| Transformer | 31 | 25-82033K01 | (Motorola Part No.) |
|---|---|---|---|
| Capacitor | 11 | 1.0 Mfd | |
| | 17 | 47 | |
| | 37 | 2.2 | |
| | 46 | 100 | |
| | 52 | 4.7 | |
| | 54 | .0015 | |
| Resistor | 12 | 4.7 K ohms | |
| | 14 | 68 | |
| | 15 | 1.2 K | |
| | 24 | 12 | |
| | 25 | 12 | |
| | 47 | 18 | |
| | 48 | 2.2 K | |
| | 50 | 10 K | |
| | 53 | 8.2 K | |
| | 55 | 1.8 K | |
| Transistor | 13 | 48-869571 | (Motorola Part No.) |
| | 20 | 48-869648 | " |
| | 21 | 48-869649 | " |
| Diodes | 21 | 48-823928803 | (Motorola Part No.) |
| | 22 | | |
| | 33 | 48-83654H01 | " |
| Voltage at terminal 16 | 24 volts | | |

While I have shown and described a specific embodiment of this invention, further modifications and improvements will occur to those skilled in the art. I desire it to be understood, therefore, that this invention is not limited to the particular form shown and I intend in the appended claims to cover all modifications which do not depart from the spirit and scope of this invention.

I claim:

1. An audio line driver amplifier having an output with high impedance comprising:
   a. a pair of complementary output transistors each having a base, an emitter and a collector with the emitters of both transistors being coupled together and the collectors of both transistors defining the output;
   b. drive means having an input adapted to receive input signals and an output connected to the bases of said transistors for providing driving current thereto in response to the input signals;
   c. feedback means coupled from the emitters of said pair of output transistors to the input of said drive means;
   d. bias means connected to said pair of output transistors for biasing said pair of output transistors so that the quiescent transistor current is less than the peak signal current in said transistors; and
   e. a bootstrap capacitor having one end coupled to the emitters of said pair of output transistors and the other end coupled to the first end of a first resistor and the first end of a second resistor, the second end of the first resistor being coupled to the bases of said output transistors and the second end of the second resistor being connected to a power reference point, said second resistor having a value for providing a current load for said output transistors.

2. An audio line driver amplifier comprising:
   a. a pair of complementary output transistors each having a base, emitter and collector with the emitters of both transistors being coupled together;
   b. drive means having an input adapted to receive input signals and an output connected to the bases of said transistors for providing driving current thereto in response to the input signals;
   c. feedback means coupled from the emitters of said pair of output transistors to the input of said drive means;
   d. bias means connected to said pair of output transistors for biasing said pair of output transistors so that the quiescent transistor current is less than the peak signal current in said transistors;
   e. a diode;
   f. isolation output transformer means having first and second primary and secondary windings with one side of the first primary winding being coupled to the collector of one of said pair of output transistors and the other side adapted to be connected to a suitable power source and one side of the second primary winding being coupled to the collector of the other of said pair of output transistors and the other side coupled through said diode to a power reference point.

3. An audio line driver amplifier as claimed in claim 2 wherein the pair of primary windings are bifilar windings.

4. An audio line driver amplifier as claimed in claim 2 wherein the output transformer is adapted to be connected to a pair of telephone lines having an impedance in the range of approximately 300 to 600 ohms and the output impedance of the amplifier is sufficiently high to connect a plurality of amplifiers in parallel without substantially affecting the impedance of the telephone lines.

5. An audio line driver amplifier as claimed in claim 2 wherein the feedback means includes components for feeding back both AC and DC signals.

6. An audio line driver amplifier as claimed in claim 2 wherein the collectors of the pair of output transistors are coupled to a single power supply.

* * * * *